United States Patent [19]
Kramer et al.

[11] Patent Number: 6,092,226
[45] Date of Patent: Jul. 18, 2000

[54] FABRICATION OF TEST LOGIC FOR LEVEL SENSITIVE SCAN ON A CIRCUIT

[75] Inventors: Allen Kramer, Hudson; Roger Brown, Colfax; Eric Fischer, Eau Claire, all of Wis.

[73] Assignee: Cray Research, Inc., Eagan, Minn.

[21] Appl. No.: 09/021,651

[22] Filed: Feb. 10, 1998

[51] Int. Cl.$^7$ .................................................. G01R 31/28
[52] U.S. Cl. .......................... 714/727; 714/726; 714/729
[58] Field of Search .................................... 714/726, 727, 714/729, 724; 324/73.1; 326/16, 12; 364/489, 490; 365/201, 154

[56] References Cited

U.S. PATENT DOCUMENTS

| | | | |
|---|---|---|---|
| 4,875,003 | 10/1989 | Burke | 324/73 R |
| 5,017,813 | 5/1991 | Galbraith et al. | 307/475 |
| 5,130,988 | 7/1992 | Wilcox et al. | 714/726 |
| 5,621,740 | 4/1997 | Kamada | 714/726 |
| 5,661,407 | 8/1997 | Shibata | 324/763 |
| 5,677,914 | 10/1997 | Fulcomer et al. | 714/724 |

*Primary Examiner*—Hoa T. Nguyen
*Attorney, Agent, or Firm*—Schwegman, Lundberg, Woessner & Kluth, P.A.

[57] ABSTRACT

An input cell to the core logic on an electrical component and an output cell from the core logic on an electrical component are provided with a first signal path for data, a second signal path for scan data, a flip flop positioned near the pad of the core logic for selecting between said first signal path for data and second signal path for scan data. The scan data is used to input special signals or vectors to the core logic and to read the results of the scan data after it has passed through the core data and has been manipulated thereby. Several of the electrical components can be electrically connected to one another. The output cell of a first chip is electrically attached to the input cell of a second electrical component. The individual electrical components are connected on a printed circuit board and typically there are electrical conductors associated with the printed circuit board that are used to electrically connect the first chip or electrical component and the second chip or electrical component.

12 Claims, 4 Drawing Sheets

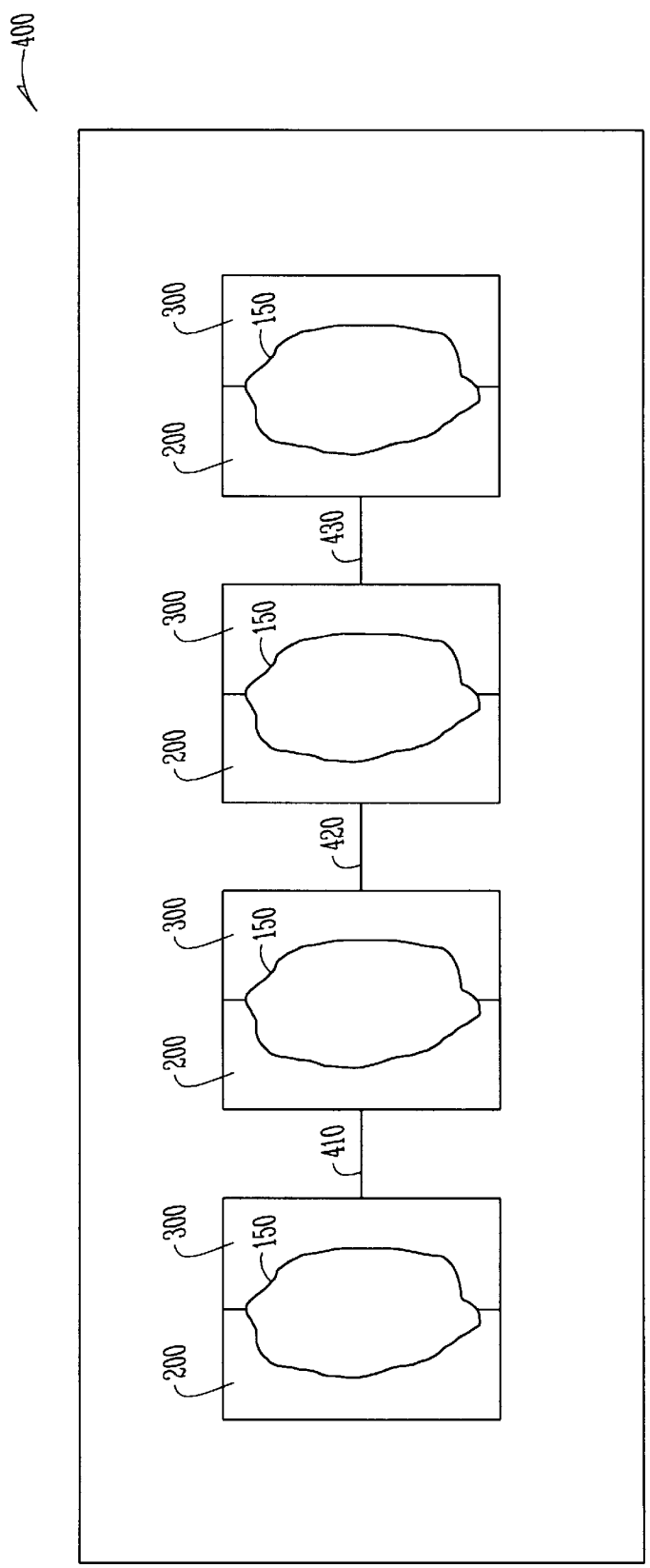

FABRICATION OF TEST LOGIC FOR LEVEL SENSITIVE SCAN ON A CIRCUIT

FIELD OF THE INVENTION

The present invention relates generally to testing for level sensitive scan designs. In particular, the present invention relates to fabrication of the test logic for level sensitive scan on an integrated circuit.

BACKGROUND OF THE INVENTION

Device packaging advances are making it nearly impossible to access device leads on PC boards. For example, new advances have allowed for high primary input/output (I/O) pin count on an application specific integrated circuit (ASIC), but allow for no observability of the connections between the ASIC and board it is used on. Level sensitive scan design, for example, boundary scan, has emerged as a way to solve the increasing difficulty in testing packaged devices. Boundary scan methodology is based on a formally adopted IEEE/ANSI standard, IEEE/ANSI 1149.1-1990. This design-in test technique provides virtual access to devices and allows for simplified pattern generation to detect and diagnose structural board faults.

Most design test techniques utilize some form of serial scan test path. At the ASIC level, design test of device logic 14 on the ASIC 10, as shown in FIG. 1, may be accomplished with the use of level sensitive scan design style flip-flops (not shown). The flip-flops are connected together to form one serial scan chain and there may be several serial scan chains or test paths on an ASIC. When all the flip-flops in the ASIC are scannable, testing of the device logic of the ASIC is simplified. A vector pattern or input test data is scanned into the serial scan chain(s). One system clock is applied and the resulting output test data is scanned out of the serial scan chain(s). Scan testing results in very high fault coverage. This is especially important on large ASICs. Scan testing further allows the use of other third party test pattern generation tools to create test vectors.

At the system level, for example, at a board level including several ASICs as shown in FIG. 1, scanning in and out test data is used to test the device logic 15 of the ASICs 10 and the interconnects therebetween. The number of test pins needed to access the board is minimized. The term 'boundary scan' has come to describe the serial scan path that is associated with testing of the input/output latches on an ASIC 10, FIG. 1, and, therefore, its interconnects as well. Boundary scan provides test access to device pins 12 by associating a serial shift registry element, or scan cell 14, with each signal pin 12. The boundary scan cells 14 are linked together to form a shift register chain around the device boundary. These scan cells 14 can then be used to control and observe the device pins 12. Each ASIC 10 on the board may have its test data out pin (TDO) connected to the test data in pin (TDI) of the next ASIC in the chain. This creates a daisy chain serial connection of all the ASICs 10 on the board and, therefore, when scanning in a test pattern, all of an ASIC's test data is scanned in at one time.

The boundary scan standard, IEEE/ANSI 1149.1-1990 is a collection of design rules applied principally at the integrated circuit (IC) level. This standard makes it possible to employ software to control the growing cost of designing and producing digital systems. The primary benefit of this standard is its ability to transform extremely difficult printed circuit board testing problems into well-structured problems that software can solve easily and swiftly. Adhering to this standard enables the purchase of both third party hardware testers and software that will automatically generate test patterns to test the ICs.

Boundary scan is similar to the scan methodology described above using level sensitive scan design type flip-flops. The difference is that, as the name infers, the scan circuitry is associated with flip-flops that make up the ASIC's boundary, i.e., primary in and out flip-flops. All of the boundary flip-flops on each ASIC are connected together into a serial scan test path. The test patterns are shifted into each ASIC under control of test access port (TAP) controller 16 clocked by a test clock input (TCK). After the test patterns are shifted into the serial scan test paths, one test clock cycle is applied and the resulting output data is shifted out of the serial scan path under control of the test access port controller. Upon checking the response data, faults can be detected. The TAP controller provides the necessary clock, data, and control function needed to use the serial scan paths for testing.

The boundary scan standard, IEEE/ANSI 1149.1-1990, mentioned above, includes design rules for the input cells and the output cells used for boundary scan testing. The specific design of the input cell for boundary scan testing includes a pair of multiplexers in the input path. The specific design of the output cell for boundary scan testing includes a pair of multiplexers in the output path. The placement of the multiplexers with respect to the I/O cells of the data path is variable and, as a result, introduces a variable amount of delay into the input path to chip, such as an ASIC, or into the output path of a chip, such as an ASIC. As a result, the amount of time necessary for a signal to pass into a chip and the amount of time for a signal to pass out of a chip also vary and must be considered in designing a printed circuit board.

Printed circuit boards are typically designed for use in a computer system or control system. A clock is included in most if not all digital computing systems or control systems. The function of the clock is to pace the operation of a digital system. A clock, such as a system clock, will be provided to a chip or board. All operations are dictated by the clock pulses. In other words, certain operations and the resulting signals produced typically have to be done in a certain number of clock cycles. Ideally, operations will have to be completed in one clock cycle. This provides for the quickest operating computer systems or control systems. Operations not only must be complete, but the resulting signal or data usually must move from one physical place to another physical place within a clock cycle. It takes a certain amount of time for signals or data to pass through conductors such as those found within a chip or such as foil found on a printed circuit. This time can be calculated quite precisely. The timing delays onto and off of a chip are generally fixed. Once these are determined, the placement of the various components on the printed circuit board is the only real time variable left that a designer can play with. Typically the length of the conductor on the printed circuit board must be short enough to allow signals to pass between the chips in a clock cycle or number of clock cylces. It should be noted that there are few chips that allow a number of clock cylces for data or other signals to pass.

Another view of this is that the path between the chips must be short enough so that the time for the signal to pass over the path added to the time associated with the delay of the output of one chip, and the time associated with the delay of the input of the next chip must be less than the clock period specified. The time necessary for the signal to travel between two chips can be varied by varying the physical location of the chips. If there is little time remaining in the clock cycle after considering delays, the length of the path of gold foil between the chips must be short to assure that the signal will be at its destination before the next clock cycle. The placement of the chips determines the path length between the chips. Board layout must assure that signals will be able to be at their destinations within a clock cycle or period. This is why the designer must consider board layout carefully.

It is very well known how much time it takes for a signal to pass along a specific length of gold foil on a printed circuit board or along any length of a particular conductor. For example, if the delay of the signal off of one chip and the delay of a signal onto another chip are both short, the length of the path of gold foil between the chips can be long. From the printed circuit board designers standpoint, these two chips could be placed most any distance apart. On the other hand, when the delay of the signal off of one chip and the delay of a signal onto another chip are both long, the length of the path of gold foil on the printed circuit board between the chips must be short. Therefore, the physical placement of two chips is critical since they must be close. Placement of the components on a printed circuit board can be extremely difficult or nearly impossible if the delays onto and off of particular chips and all relatively long.

This design consideration interferes with implementations of other design concepts. One such design concept is generally termed floor planning. The concept of floor planning is that the various components can be placed anywhere on the printed circuit board. In other words, a designer merely has to fit the various components on a board and does not have to consider the length of foil or conductor between the components. The concept of floor planning is much more difficult to implement when delay times have to be considered in the design or layout of the printed circuit board. Typically there is one critical path that must be considered. This may effect several other chips.

The design consideration also interferes with substituting components which may have different delay times for the signal passing onto the chip or off of the chip. A new revision may require a different component. In addition, suppliers of the components may produce revised components in which the timing has been varied. Accommodating such revisions would be easier if timing delays onto the chip and off of the chip were known or fixed, rather than variable.

For these reasons and others, there is a need in the art for enhancements to minimize or substantially shorten signal delay times on and off a chip. There is also a need to accomplish this such that the standard logic tests and testing devices used in present boundary scan schemes can be used in an enhanced version. Preferably, the fabrication testing of the test logic of a level sensitive scan design. There is also a need to accomplish this task with a minimal amount of cost to chip manufacturers so that they will not be adverse to implementing such a boundary testing scheme. There is also a need for a minimal amount of change in logic in the input cells and the output cells.

SUMMARY OF THE INVENTION

An input cell to the core logic on an electrical component and an output cell from the core logic on an electrical component are provided with a first signal path for data, a second signal path for scan data, a flip flop positioned near the pad of the core logic for selecting between said first signal path for data and second signal path for scan data. The scan data is used to input special signals or vectors to the core logic and to read the results of the scan data after it has passed through the core data and has been manipulated thereby.

Several of the electrical components can be electrically connected to one another. The output cell of a first chip is electrically attached to the input cell of a second electrical component. The individual electrical components are connected on a printed circuit board and typically there are electrical conductors associated with the printed circuit board that are used to electrically connect the first chip or electrical component and the second chip or electrical component.

The input cells and the output cells use a flip flop rather than a multiplexer in the data path and in the data scan path. By removing the multiplexer a somewhat inherently slow component is removed from the data path. More importantly, the delay associated with placement of the multiplexer in the input cell or in the output cell of the data path is lessened. The placement of the flip flop can be controlled. By removing the multiplexer and requiring that the flip flop be close to an I/O pad, a very controlled I/O can be achieved. The delay associated with an I/O using a flip flop is much more predictable. The delay associated with the flip flop is also less than the I/O using a multiplexer.

Use of a flip flop in the input cell and in the output cell also removes one layer of logic. The internal scan type testing at a chip level, such as ATTPG, of most chips is implemented in the chip hardware as a series of flip flops forming one or more internal scan chains. The idea is to isolate the first level of flip flops of an internal scan chain by moving them out of the internal scan chain and into the input cell or boundary scan area. Similarly, the last level of flip flops of the internal scan chain are isolated by moving them out of the internal scan chain and into the output cell or boundary scan area. These flip flops replace the multiplexer in the input cell and in the output cell.

BRIEF DESCRIPTION OF THE DRAWINGS

FIG. 4 is a block diagram showing several components electrically connected to one another in accordance with this invention.

DETAILED DESCRIPTION OF THE PREFERRED EMBODIMENT

In the following detailed description of the preferred embodiments, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

Figure 1:
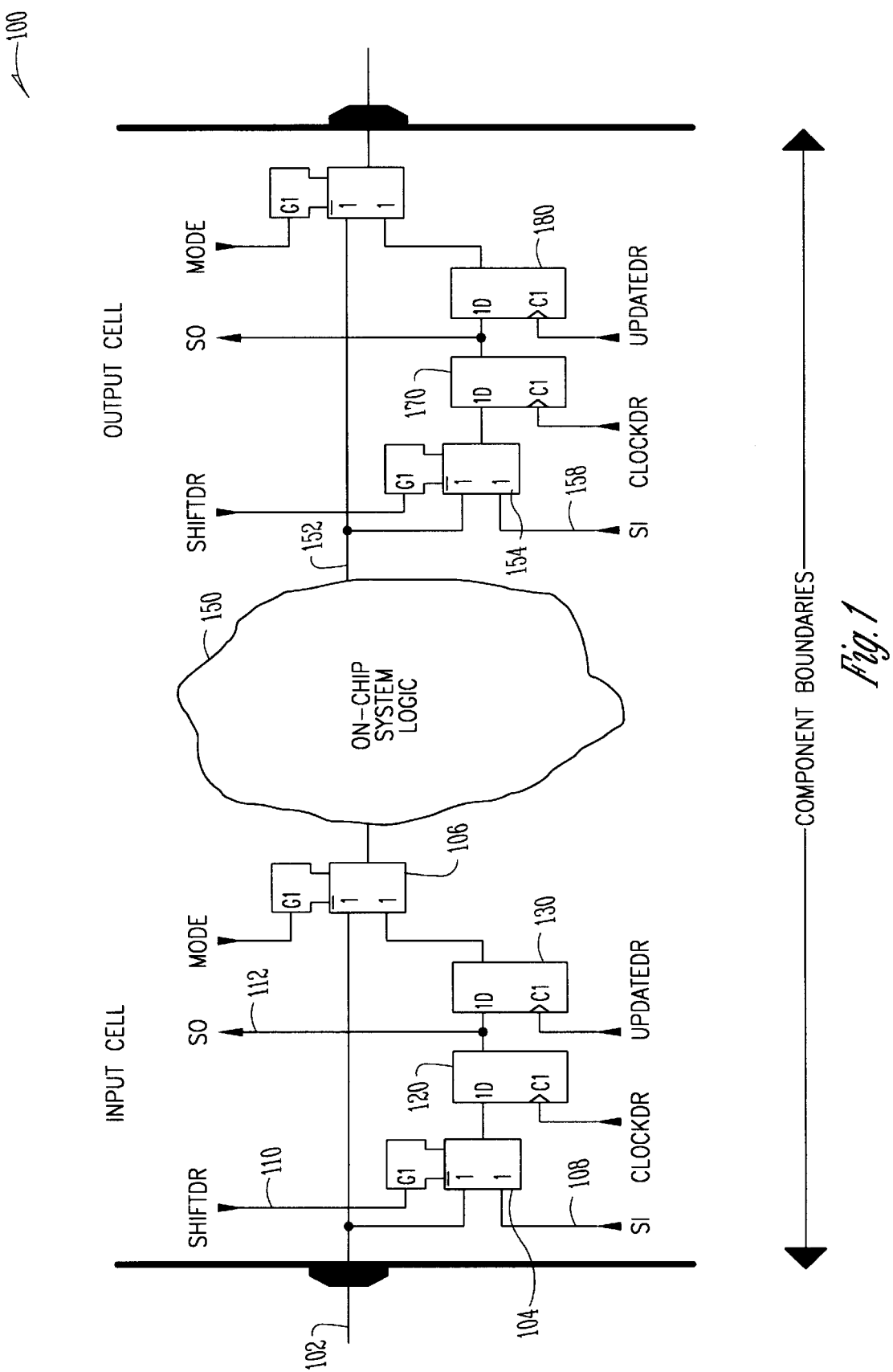
FIG. 1 is a schematic diagram showing boundary scan at a chip or component level.

Referring to FIG. 1, the electrical architecture of an electrical component 100 complying with the IEEE/ANSI 1149.1-1990 standard is shown. The electrical architecture is a standard set by the Joint Test Action Group and also known as JTAG. The JTAG Architecture provides standardized approaches to: (1) testing the interconnection between IC's once they have been assembled into a printed circuit board ("PCB"), (2) testing the IC itself, and (3) observing or modifying circuit operation during a component's normal operation. In FIG. 1, a known implementation of a boundary-scan cell with sample, preload and set capability is shown as comprising an input cell 101, core logic 150 and an output cell 151. The input cell 101 comprises a signal in or data in port 102 coupled to a first input of a first multiplexer 104 and a first input to a second multiplexer 106. The output of the second multiplexer 104 provides a signal out port which in this case is an input to the core logic 150 of the electrical component 100. A second input of the multiplexer 104 is coupled to receive a scan data in (sdi) 108. Multiplexer 104 has a select input coupled to receive a shift/load signal (ShiftDR) 110. The output of the multiplexer 104 is coupled to the D input of a D-type capture flip-flop 120 whose output is coupled to the D input of a D type update flip-flop 130, whose output is coupled to a second input of the multiplexer 106. The output of the D type capture flip-flop 120 also provides a scan out signal (SO) 112. Multiplexer 106 has a select input coupled to receive a mode signal 114. Flip-flops 120 and 130 are coupled to receive gated clock signals CKDR, UDDR, respectively. The various control signals and gated clock signals are generated by a TAP controller (not shown). The architecture shown is asynchronous in the sense that the clock signals CKDR, UDDR, are clock signals produced by gating an input clock sign with the TAP controller (not shown). One of the advanatages of architectures complying with the JTAG standard is that the D-type capture flip-flops can read after data begins to flow in the data path. In other words, boundary scan testing does not interrupt the flow of data.

The output cell 151 has essentially the same architecture as the input cell 101. The output cell 151 comprises a signal in or data in port 152, which in this case is the output from the core logic 150, coupled to a first input of a first multiplexer 154 and a first input to a second multiplexer 156. The output of the second multiplexer 154 provides a signal out port. A second input of the multiplexer 154 is couple to receive a scan data in (sdi) 158. Multiplexer 154 has a select input coupled to receive a shift/load signal (ShiftDR) 160. The output of the multiplexer 154 is coupled to the D input of a D-type capture flip-flop 170 whose output is coupled to the D input of a D type update flip-flop 180, whose output is coupled to a second input of the multiplexer 156. The output of the D type capture flip-flop 170 also provides a scan out signal (SO) 162. Multiplexer 156 has a select input coupled to receive a mode signal 164. Flip-flops 170 and 180 are coupled to receive gated clock signals CKDR, UDDR respectively. The various control signals and gated clock signals are generated by a TAP controller (not shown). As mentioned above, the architecture shown is asynchronous in the sense that the clock signals CKDR, UDDR, are clock signals produced by gating an input clock signal with the TAP controller (not shown).

The placement of the multiplexers in the input cell or the output cell of the data path is variable and, as a result, introduces a variable amount of timing delay into the input path to the core logic of an electrical component or into the output path from the core logic of the core logic. As a result, the amount of time necessary for a signal to pass into a chip and the amount of time for a signal to pass away from the core logic of a electronic component will also vary and must be considered in designing a printed circuit board. Once the timing delays are determined, the placement of the various components on the printed circuit board must be close enough to account for the delay associated with the output of one chip, the delay associated with the input of the next chip, and the time for the signal to travel between the two chips. The time necessary for the signal to travel between two chips is determined by the length of the path of gold foil on the printed circuit board.

It is very well known how much time it takes for a signal to pass along a specific length of gold foil on a printed circuit board or along any length of a particular conductor. For example, if the delay of the signal off of one chip and the delay of a signal onto another chip are both short, the length of the path of gold foil between the chips can be long. From the printed circuit board designers standpoint, these two chips could be placed most any distance apart. On the other hand, when the delay of the signal off of one chip and the delay of a signal onto another chip are both long, the length of the path of gold foil on the printed circuit board between the chips must be short. Therefore, the physical placement of two chips is critical since they must be close. Placement of the components on a printed circuit board can be extremely difficult or nearly impossible if the delays onto and off of particular chips and all relatively long.

This design consideration interferes with implementations of other design concepts used to ease the task of logic design, such as floor planning. This design consideration also makes substitutions of chips such as for providing a new revision to a chip more difficult.

Figure 2:
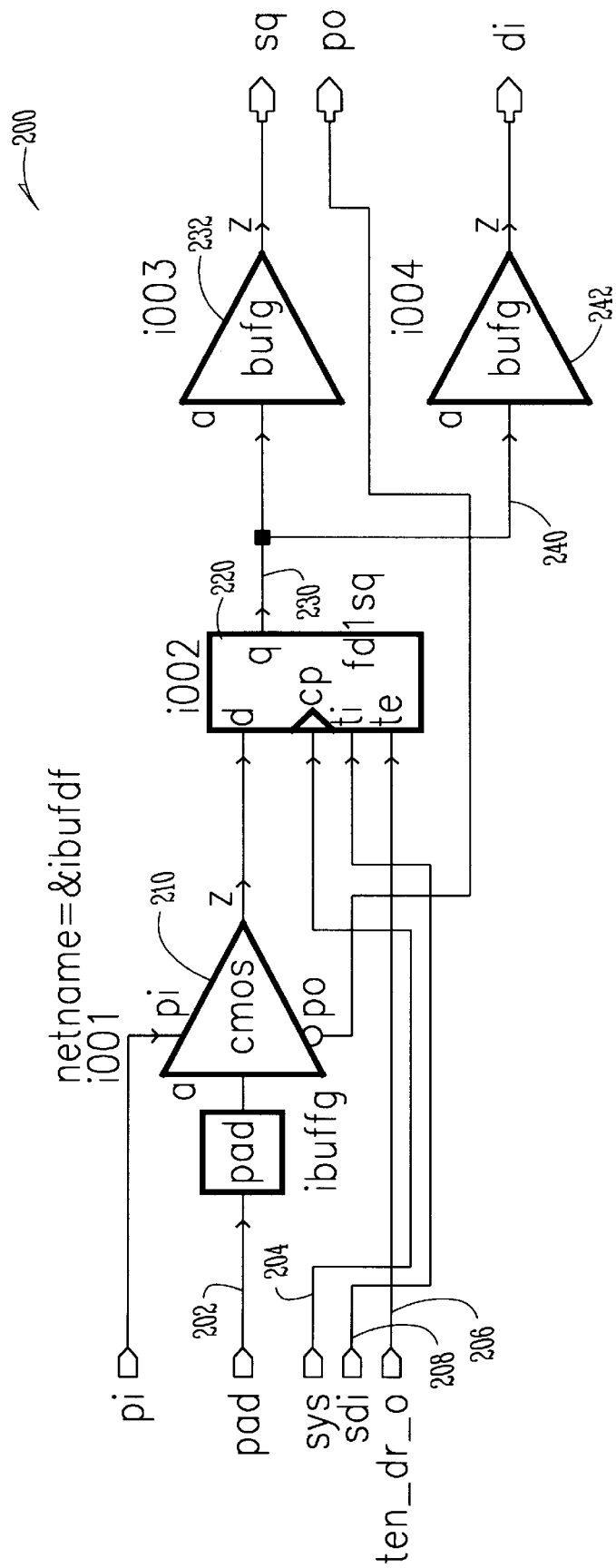
FIG. 2 is a schematic diagram showing the input cell of this invention.
Figure 3:
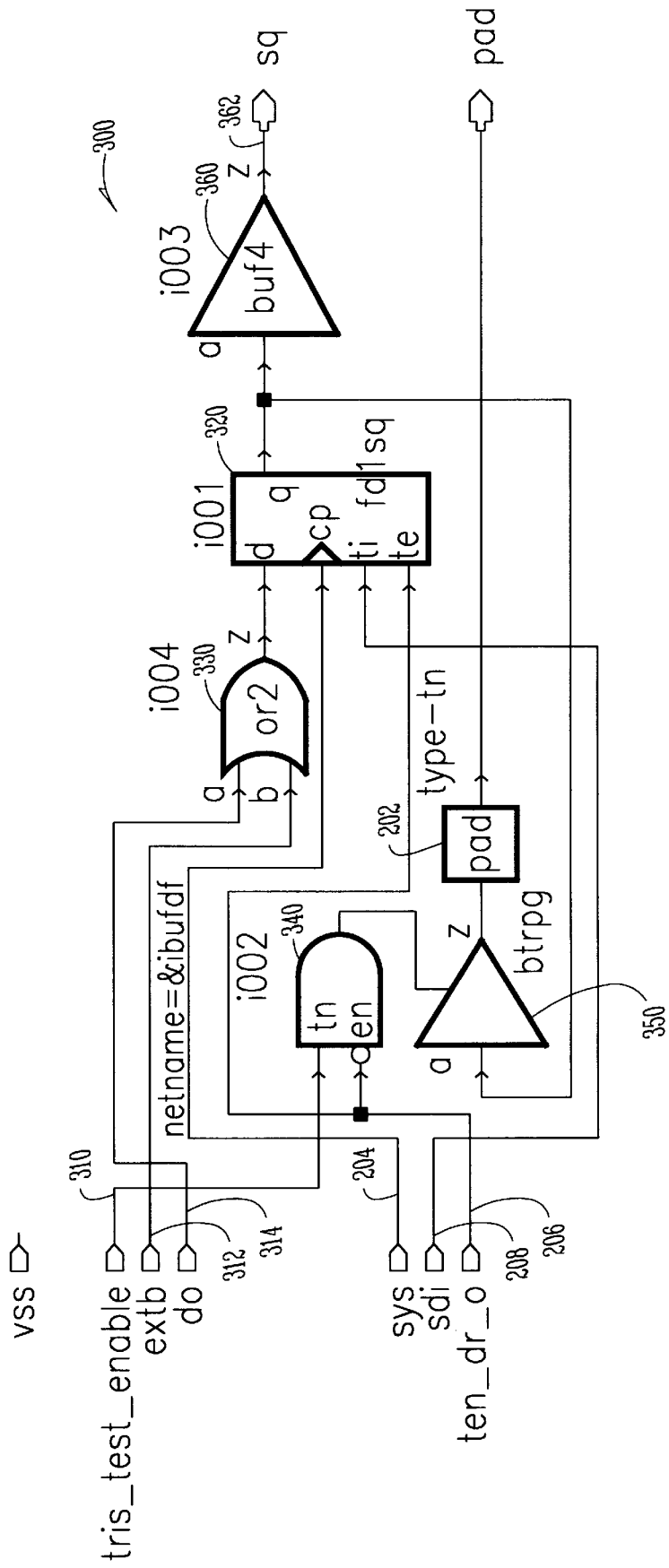
FIG. 3 is a schematic diagram showing the output cell of this invention.

FIGS. 2–4 describe the present invention. FIG. 2 is a schematic diagram of an input cell 200 and FIG. 3 is a schematic diagram of an output cell 300 according to the teachings of this invention. The theory behind the invention will be discussed first with respect to both the input cell 200 and the output cell 300. As shown in FIGS. 2 and 3, the input cell 200 and the output cell 300 which are used for boundary scan remove a multiplexer from of the data path. By removing the multiplexer, a somewhat inherently slow component is removed from the data path of either the input cell 200 or the output cell 300. In addition, and more importantly, the delay associated with placement of the multiplexer with respect to the data path of the input cell 200 and the data path of the output cell 300 is eliminated. By removing the multiplexer and requiring that the flip flop be close to an I/O pad, the timing for getting a signal to the core logic and the timing for getting a signal from the core logic can be more precisely controlled. The end result is an electrical component featuring a very controlled I/O.

The internal scan type testing at a chip level, such as ATTPG, of most chips is implemented in the chip hardware as a series of flip flops forming one or more internal scan chains. The theory of this invention is to isolate the first level of flip flops of an internal scan chain by moving them out of the internal scan chain and into the input cell or boundary scan area. Similarly, the last level of flip flops of the internal scan chain are isolated by moving them out of the internal scan chain and into the output cell or boundary scan area.

FIG. 2 is a schematic diagram showing the input cell of this invention. The input cell 200 is for inputting data and inputting scan data into the core logic 150 of an electrical component (shown in FIG. 4). The input cell 200 comprises a signal path for data 202 which is denoted as pad in the schematic. The signal path for data also is a data input port. A signal path for scan data 208 is also provided. The signal path for scan data in 208 is denoted "sdi". There are also inputs for the system clock 204 (denoted "sys") and test scan enable 206 (denoted "ten_dr_0") to the flip flop 220.

The signal path for data 202 includes an input receiving cell 210 that takes the data right off the pad. The signal path for data 202 is then input to a flip flop with a multiplexer 220. When test scan enable 206 is low, data passes through the flip flop and output to the driver 242 and into the core logic of the chip. The system clock 204 is also input to the flip flop 220 and cordinates the transfer of the data.

Scan data in is also input to the flip-flop 220. When test scan enable is high or a logical 1, a boundary scan test is taking place. The test scan enable signal 206 results in a selection of the scan data in 208 to be the input to the flip flop and also output from the flip flop 220. The vector or specific input is determined by the TAP controller. The scan data in is actually output from the TAP controller. The system clock 204 which is input to the flip flop 220, provides the timing for proper delivery of the scan data in 208 to the flip flop 220. The TAP controller presents the scan data in 208 to the input of the flip flop 220 during the precise clock cycle when a scan test is being run. When test scan enable 206 is high or logical 1, pad of the output cell 300 is essentially disabled or silent (see discussion below with respect to the output cell). Thus, the data on pad does not pass since it is not driven by driver 350. The scan chain which is output from the flip flop 220 is driven by driver 232 onto the chip or into the core logic of the chip.

There are several types of scan tests which are determined by the JTAG standard. There are two predominant types of scan tests. One is called the sample preload. The second type of scan test is an external boundary scan test. The sample preload is a pretest to test the integrity of the circuit that is conducted before the external boundary scan test. During one type of scan test, the scan chain is driven though the core logic during one clock cycle. The output is then placed into the output cells and read out during the subsequent clock cycle. During a second type of scan test, the foil or conductor path between the output cell 300 of one chip and the input cell 200 of another chip. The flip flops of the input cell 200 can then be checked to see that the conductor is good.

To summarize briefly, the flip flop 220 allows the data to pass to the core logic 150 when a test scan enable signal is low. When the test scan enable signal is high, the flip flop 220 allows scan data in 208 to pass to the core logic 150. The system clock 204 is used to clock the data out of the flip flop when either the data is passed to the core logic or when the scan data in is passed to the core logic 150. The input cell 200 further comprises a driver 232 associated with an output path 230 from flip flop 220 for the scan data chain. The input cell 200 further comprises a driver 242 associated with an output path 240 from the flip flop 220 for the data.

Advantageously, the flip flop 220 of the input cell 200 is positioned near the pad of the core logic so that the delay time between the pad 202 of the chip and the core logic 150 can be controlled and preferably minimized. In performing a scan test with the arrangement described above, the data stream is interrupted for a clock cycle during the performance of te scan test. In a JTAG standard circuit, such an interrupt does not occur. The advantage of having tight control over the I/O times onto and off the chip overcomes this slight disadvantage.

FIG. 3 is a schematic diagram showing the output cell 300 of this invention. The output cell 300 is for outputting data and outputting scan data. The scan data can be output into another input of an input cell thereby forming a scan chain. The inputs to the output cell 300 include tri-state test enable 310, extb 312, data out 314, the system clock 204, scan data in 208 and test scan enable 206. The input extb 312 is from the TAP controller.

The extb signal 312 indicates which type of boundary scan test will be run. The extb signal 312 is a decode of certain bits in an instruction register of the TAP controller which is used to perform boundary scans using the JTAG protocol. In the presence of a boundary scan test, an OR gate 330 is presented with an extb high signal which produces an output of 1 or a true from the OR gate 330 and into a flip flop 320. Thus, when there is a boundary scan test, a 1 is presented to the data port of the flip flop 320.

The tri-state test enable input 310 disables all tri-states simultaneously for the purpose of running a leakage test. All drivers draw current. The tri-state test enable signal 310 is input to an AND gate 340. Normally, the tri-state test enable is low or a logical zero (Roger Brown, is this the correct value?—if not change the value in the next sentence too). When tri-state test enable 310 (input tn of AND 340) is set to a logical 1 or high, the driver 350 which normally drives pad 202 is tested for leakage. Leakage is a loss of energy through a stray path in the component not intended for conduction. In this instance, the driver 350 is being tested for leakage when the tri-state test enable signal is set to a logical 1 or high.

The other input to the AND gate 340 is the test scan enable signal 206. When the test scan enable signal 206 is a 1 or high the driver 350 is functionally turned off. As a result, pad 202 is not driven by driver 350. The information or output from the flip flop 320 is not passed on to the pad 202. The output from flip flop 320 is not driven to the pad 202. During a boundary scan test, the test scan enable signal is high or a logical 1. As a result, the output of the flip flop which is part of the boundary scan test, is not driven to pad 202 but rather the output of the flip flip 320 is driven by driver 360 on the scan chain line 362. The scan chain line 362 of the ouput cell 300 becomes the scan data in line 208 of the next input cell 200.

When the test scan enable signal 206 is low or logical zero, a boundary scan test is not being performed. The output of the flip flop 320 is then driven to the pad 202. In other words, data is passed to the pad 202 of the output cell 300 and then to the pad 202 to the subsequent input cell 200. This is the mode for the normal operation of the circuits which include the core logic of several chips on a board. The output of the AND gate is an input to a driver 350 which is used to drive the data toward the pad 202 of the output of the output cell 300. When the output of the flip flop 320 is being driven by driver 350, it is data that is being driven toward the pad 202. The data comes from the flip flop 320 when scan data is not being passed through the flip flop 320.

The flip flop 320 has the output of the OR gate 330 as one data input, the system clock 204 as another input, test data in or scan data in as yet another input and test scan enable 206 as a further input. The clock input is used to clock the data into and out of the flip flop or to clock the scan data into and out of the flip flop 320. The test scan enable signal 206 selects whether data or a scan chain will be the output of the combinination flip flop and mux 320. When test scan enable signal is high or 1, a boundary scan test is being performed. During the same clock period, the test scan enable essentially disables the driver 350 for the pad 202. The output of the flip flop 320 then goes to the driver 360 and is driven on line 362. If the boundary scan test starts at the output cell 300, the output of the flip flop 320 is loaded into the flip flop 220 of a subsequent input cell 200. If the output of the flip flop 320 is correct and in the flip flop 220 during the clock cycle, the signal path between the output cell of the first chip and the input cell of the second chip are considered to have been tested.

When the scan data in 208 is high and the output of the OR gate 330 is low, the scan data is passed through the flip flop and output to a driver 360 which drives the scan chain line 362. When data is presented to the flip flop, it is passed through the OR gate and passed through the flip flop 320 and the tri-state enable hardware and out to pad 202. The specifics of the tri-state enable hardware was discussed above. The specifics of its operation will not be repeated here.

FIG. 4 shows a schematic of a number of electrical components on a printed circuit board 400. Each component is comprised of an input cell 200, core logic 150 and an output cell 300. Each electrical component is attached to the next electrical component by an electrically conductive path associated with the printed circuit board 400. For example, path 410 is the path between a first electrical component and a second electrical component, path 420 is the electrically conductive path between a second cell and a third cell, and path 430 is an electrically conductive path between the third electrical component and the fourth electrical component. The advantage of having the input and output cell using a flip flop is shown in FIG. 4. As can be seen, the electrically conductive path 430 is much longer than the electrically conductive path 410 or the electrically conductive path 420. When using the invention, the amount of delay for passing through the input cell 200 of a particular electrical component and the output cell 300 of a particular electrical component is very controlled and also very short. The end result is that the length of the electrical paths 410, 420, and 430, are less critical. In other words, delay introduced for passing along a longer path such as path 430 is no longer critical in most instances. Thus, the electrical components themselves can be replaced with other electrical components and the length of the paths 410, 420 or 430 is no longer important or is no longer as important.

This also lends itself toward certain other design theories such as floor planning wherein an electrical component having a function can be used on any particular printed circuit board and the position on the circuit board is not overly critical. Of course, it should be understood that extremely long paths will still introduce an amount of delay that may cause problems with the printed circuit board, however, by using a flip flop in the input cell 200 and the output cell 300, the delay on the chip is diminished to the point that the length of the electrically conductive path becomes less critical.

Advantageously, the flip flop 220 of the input cell 200 is positioned near the pad of the core logic so that the delay time between the pad 202 of the chip and the core logic 150 can be controlled and preferably minimized. Similarly, the flip flop 320 of the output cell 300 is positioned near the pad of the core logic so that the delay time between the pad 202 of the chip and the core logic 150 and can also be controlled and preferably minimized. It should be noted that when performing a scan test using the above described input cell 200 and the output cell 300, the data stream is interrupted for a clock cycle during the performance of the scan test. In a JTAG standard circuit, such an interrupt does not occur. The advantage of having tight control over the I/O times onto and off the chip overcomes this slight disadvantage. In addition, it should be noted that the input cell 200 and the output cell 300 also respond to the same JTAG standard commands. Thus, a new nonstandard protocol does not have to be adopted to use this invention.

Although specific embodiments have been illustrated and described herein, it is appreciated by those of ordinary skill in the art that any arrangement which is calculated to achieve the same purpose may be substituted for the specific embodiments shown. This application is intended to cover any adaptations or variations of the present invention. Therefore, it is manifestly intended that this invention be limited only by the claims and the equivalents thereof.

What is claimed is:

1. An input cell for inputting data and inputting scan data into the core logic of a chip, comprising:
    a first signal path for data;
    a second signal path for scan data;
    a flip flop positioned near the pad of the core logic for selecting between said first signal path and second signal path.

2. An input cell for inputting data and inputting scan data into the core logic of a chip, comprising:
    a first signal path for data;
    a second signal path for scan data;
    a flip flop positioned near the pad of the core logic for selecting between said first signal path and second signal path and
    a first driver associated with a first path.

3. An input cell for inputting data and inputting scan data into the core logic of a chip, comprising:
    a first signal path for data;
    a second signal path for scan data;
    a flip flop positioned near the pad of the core logic for selecting between said first signal path and second signal path and
    a second driver associated with the second path.

4. The input cell of claim 3 further comprising a first driver associated with a first path.

5. An output cell for outputting data and outputting scan data from the core logic of a chip, comprising:
    a first signal path for data;
    a second signal path for scan data;
    a flip flop positioned near the pad of the core logic for selecting between said first sign path and second signal path.

6. The output cell of claim 5 further comprising a driver for the output line from the flip flop.

7. An output cell for outputting data and outputting scan data from the core logic of a chip comprising:
    a first signal path for data;
    a second signal path for scan data;
    a flip flop positioned near the pad of the core logic for selecting between said first sign path and second signal path and;
    an OR gate which controls the flow of data in the output cell.

8. An output cell for outputting data and outputting scan data from the core logic of a chip comprising:
    a first signal path for data;
    a second signal path for scan data;
    a flip flop positioned near the pad of the core logic for selecting between said first sign path and second signal path and;
    a gate responsive to a tristate enable signal for controlling the enablement of boundary test conditions.

9. A circuit comprising:
    first core logic further comprising:
        a plurality of input pads; and
        a plurality of output pads;
        an input cell to said first core logic further comprising,
    a first signal path for data;
        a second signal path for scan data; and
        a flip flop positioned near the input pads to the core logic for the first signal path and the second signal path, said flip flop for selecting between said first sign path and second signal path.

10. The circuit of claim 9 further comprising:

an output cell from said first core logic for outputting data and outputting scan data from the core logic of a chip, comprising:
- a third signal path for data;
- a fourth signal path for scan data; and
- a flip flop positioned near the output pads from the core logic for the third and fourth signal paths, said flip flop for selecting between said third signal path and fourth signal path.

11. The circuit of claim 10 further comprising:

second core logic further comprising:
- a plurality of input pads; and
- a plurality of output pads;

an input cell to said second core logic further comprising,
- a first signal path for data;
- a second signal path for scan data; and
- a flip flop positioned near the input pads to the second core logic for the first signal path and the second signal path, said flip flop for selecting between said first signal path and second signal path, said first signal path of the second core logic electrically connected to the third signal path of the first core logic and the second signal path of the second core logic electrically connected to the fourth signal path of the first core logic.

12. The circuit of claim 11 further comprising:

an output cell from said second core logic for outputting data and outputting scan data from the core logic of a chip, comprising:
- a third signal path for data;
- a fourth signal path for scan data; and
- a flip flop positioned near the output pads from the second core logic for the third and fourth signal paths, said flip flop for selecting between said third signal path and fourth signal path.

* * * * *